(12) United States Patent
Burton (10) Patent No.: US 10,319,700 B1
(45) Date of Patent: Jun. 11, 2019

(54) STACKED SEMICONDUCTOR ARCHITECTURE INCLUDING SEMICONDUCTOR DIES AND THERMAL SPREADERS ON A BASE DIE

(71) Applicant: Intel Corporation, Santa Clara, CA (US)

(72) Inventor: Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 15/859,404

(22) Filed: Dec. 30, 2017

(51) Int. Cl.
| H01L 23/66 | (2006.01) |
| H01L 25/065 | (2006.01) |
| H01L 23/367 | (2006.01) |
| H01L 23/373 | (2006.01) |
| H01L 23/00 | (2006.01) |
| H01L 25/00 | (2006.01) |

(52) U.S. Cl.
CPC ...... H01L 25/0652 (2013.01); H01L 23/3675 (2013.01); H01L 23/3736 (2013.01); H01L 23/3738 (2013.01); H01L 24/27 (2013.01); H01L 24/32 (2013.01); H01L 24/83 (2013.01); H01L 25/50 (2013.01); H01L 24/73 (2013.01); H01L 2224/32245 (2013.01); H01L 2224/73253 (2013.01); H01L 2225/06506 (2013.01); H01L 2225/06513 (2013.01); H01L 2225/06555 (2013.01); H01L 2225/06589 (2013.01)

(58) Field of Classification Search
CPC ....... H01L 25/0657; H01L 2224/48137; H01L 2225/06589; H01L 2225/06582; H01L 2224/32145; H01L 2224/48145; H01L 2224/16145; H01L 25/0753
USPC ....................................................... 313/501
See application file for complete search history.

(56) References Cited

U.S. PATENT DOCUMENTS

| 2015/0108628 | A1* | 4/2015 | Yu | ........................ H01L 23/42 257/712 |
| 2015/0162307 | A1* | 6/2015 | Chen | .................. H01L 25/0655 257/712 |

* cited by examiner

Primary Examiner — Roy K Potter
(74) Attorney, Agent, or Firm — Schwabe, Williamson & Wyatt, P.C.

(57) ABSTRACT

Stacked semiconductor die architectures having thermal spreaders disposed between stacked semiconductor dies and techniques of forming such architectures are described. The stacked semiconductor die architectures may be included in or used to form semiconductor packages. A stacked semiconductor die architecture can include: (i) a base die; (ii) a plurality of stacked semiconductor dies arranged on the base die; and (iii) at least one thermal spreader disposed in one or more gaps between the plurality of stacked semiconductor dies or in one or more areas on the base die that are adjacent to the plurality of stacked semiconductor dies. The thermal spreaders can assist with thermal management of the dies, which can assist with improving the power density of the stacked semiconductor die architecture. At least one other stacked semiconductor die architecture s also described.

25 Claims, 9 Drawing Sheets

STACKED SEMICONDUCTOR ARCHITECTURE INCLUDING SEMICONDUCTOR DIES AND THERMAL SPREADERS ON A BASE DIE

BACKGROUND

Field

Embodiments described herein relate to stacked semiconductor die architectures for semiconductor packages. More specifically, embodiments described herein relate to stacked semiconductor die architectures that include semiconductor dies and thermal spreaders on a base die and techniques of forming such architectures.

Background Information

High performance computing applications, such as servers, are driving an increase in the power density required of stacked semiconductor die architectures. However, as power density increases, so does unwanted thermal energy. This unwanted thermal energy, therefore, can limit the power density of a stacked semiconductor die architecture to a level that is much lower than what the stacked semiconductor die architecture can produce.

BRIEF DESCRIPTION OF THE DRAWINGS

Embodiments described herein are illustrated by way of example and not limitation in the figures of the accompanying drawings, in which like references indicate similar features.

DETAILED DESCRIPTION

Embodiments described herein are directed to stacked semiconductor die architectures that include semiconductor dies and thermal spreaders on a base die and techniques of forming such architectures. Embodiments of the stacked semiconductor die architectures described herein may be included in or used to form semiconductor packages. In one embodiment, a plurality of semiconductor dies are stacked on a base die. The stacked semiconductor dies may be arranged on the base die in different ways (e.g., an arrangement that includes gaps between the stacked dies, an arrangement that requires the stacked dies to be in a group, etc.). The arrangement can be a ring arrangement, a mesh arrangement, or any other suitable arrangement. In one embodiment, one or more thermal spreaders are placed on the base die in the gaps between the stacked semiconductor dies. In one embodiment, one or more thermal spreaders are placed on one or more areas or regions of the base die that are adjacent to the stacked semiconductor dies. In a further embodiment, one or more thermal spreaders are placed on one or more areas or regions of the base die that are adjacent to a group of stacked semiconductor dies, where the group does not include any thermal spreader between any two of dies in the group. The thermal spreaders can be formed from a silicon semiconductor die or from copper, aluminum, steel, nickel, any other metal, a metal alloy, any other conductive material, or any combination thereof. The thermal spreaders can assist with thermal management of the semiconductor dies, which can assist with increasing the power density provided by stacked semiconductor die architecture. In a further embodiment, at least one of the thermal spreaders provides an electrical function for the stacked semiconductor die architecture. This electrical function can include, but is not limited to, minimizing detrimental changes in electrical impedance of signal paths in the architecture and voltage regulation via a plurality of inductors. In short, and in one embodiment, a stacked semiconductor die architecture includes: (i) at least one base die; (ii) a plurality of stacked semiconductor dies on the base die; and (iii) one or more thermal spreaders on the base die in one or more gaps between the plurality of stacked semiconductor dies or in one or more areas of the base die that are adjacent to the plurality of stacked semiconductor dies. In a further embodiment, the stacked semiconductor die architecture also includes a heat sink in contact with the thermal spreaders and/or the stacked semiconductor dies to assist with thermal management. The heat sink can also be in electrical contact with the base die. In this way, the heat spreader can assist with providing an electrical spreading function for the stacked semiconductor die architecture. The heat sink may also be patterned to include a set of inductors for power conversion (e.g. DC to DC conversion, etc.).

Figure 1A:
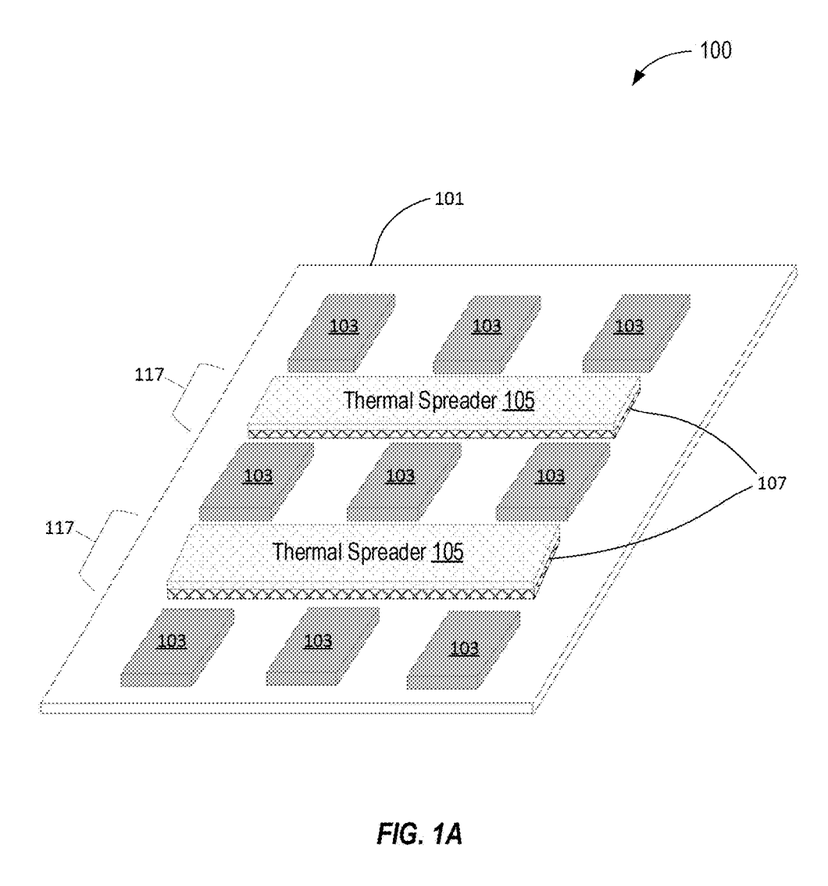
FIGS. 1A-1B are isometric views of stacked semiconductor architectures that includes a plurality of stacked semiconductor dies and a plurality of thermal spreaders on a base die, according to one or more embodiments.

Referring now to FIG. 1A, one embodiment of a stacked semiconductor die architecture 100 is shown. The architecture 100 includes a base die 101, multiple stacked semiconductor dies 103 on the base die 101, and multiple thermal spreaders 105 on the base die 101 in gaps 117 between the stacked semiconductor dies 103. The stacked semiconductor dies 103 in the architecture 100 may be arranged, with gaps 117 in between one or more of the stacked semiconductor dies 103, in a ring arrangement, a square arrangement, a rectangular arrangement, a polygonal arrangement, a mesh arrangement, or any other suitable arrangement. As used herein, a "stacked semiconductor die" and its variations refer to at least one semiconductor die that is mounted on a base die. In some embodiments, a stacked semiconductor die includes multiple semiconductor dies that are stacked on top of each other on a base die. For example, a stacked semiconductor die can include two or more dies stacked on each other, where the stack is on a base die. For some embodiments, a "stacked semiconductor die" can include a die block. Each die block can be a stacked die package or non-stacked die package.

In one embodiment, a surface area of the base die 101 is larger than surface areas of the stacked dies 103 and the thermal spreaders 105. In one embodiment, the base die 101, the multiple stacked dies 103, and the multiple thermal spreaders 105 are electrically coupled to each other through electrical communication pathways (e.g., electrical traces, etc.). The base die 101 can comprise a monolithic base die or a plurality of disaggregated base dies.

Although not shown in FIG. 1A, the architecture 100 may include electrical connections between two or more of the thermal spreaders 105, the stacked semiconductor dies 103, and the base die 101. These electrical connections include, but are not limited to, interconnect structures (e.g., bumps, microbumps, pillars, wire bonds, etc.). These electrical connections may be formed from suitable materials known in the art of semiconductor fabrication (e.g., copper, palladium, aluminum, steel, nickel, any other metal, a metal alloy, any other conductive material, or any combination thereof, etc.).

In one embodiment, the thermal spreaders 105 can assist with thermal management of the base die 101 and the multiple stacked dies 103. In this way, the thermal spreaders 105 can assist with heat dissipation from a semiconductor package that includes the stacked semiconductor architecture 100. In one embodiment, the thermal spreaders 105 can assist with providing low lateral AC and DC electrical impedance. In another embodiment, at least one of the thermal spreaders 105 is designed to provide a high inductance with a low resistance. For example, at least one of the thermal spreaders 105 can include integrated voltage regulators formed from inductors used in DC to DC conversion. The thermal spreaders 105 can be formed from copper, or any other suitable metal or metal alloy capable of thermal management as is known in the art of semiconductor manufacturing and fabrication. Additional details about the compositions of thermal spreaders 105 is described below in connection with FIGS. 2A-2C.

Figure 1B:
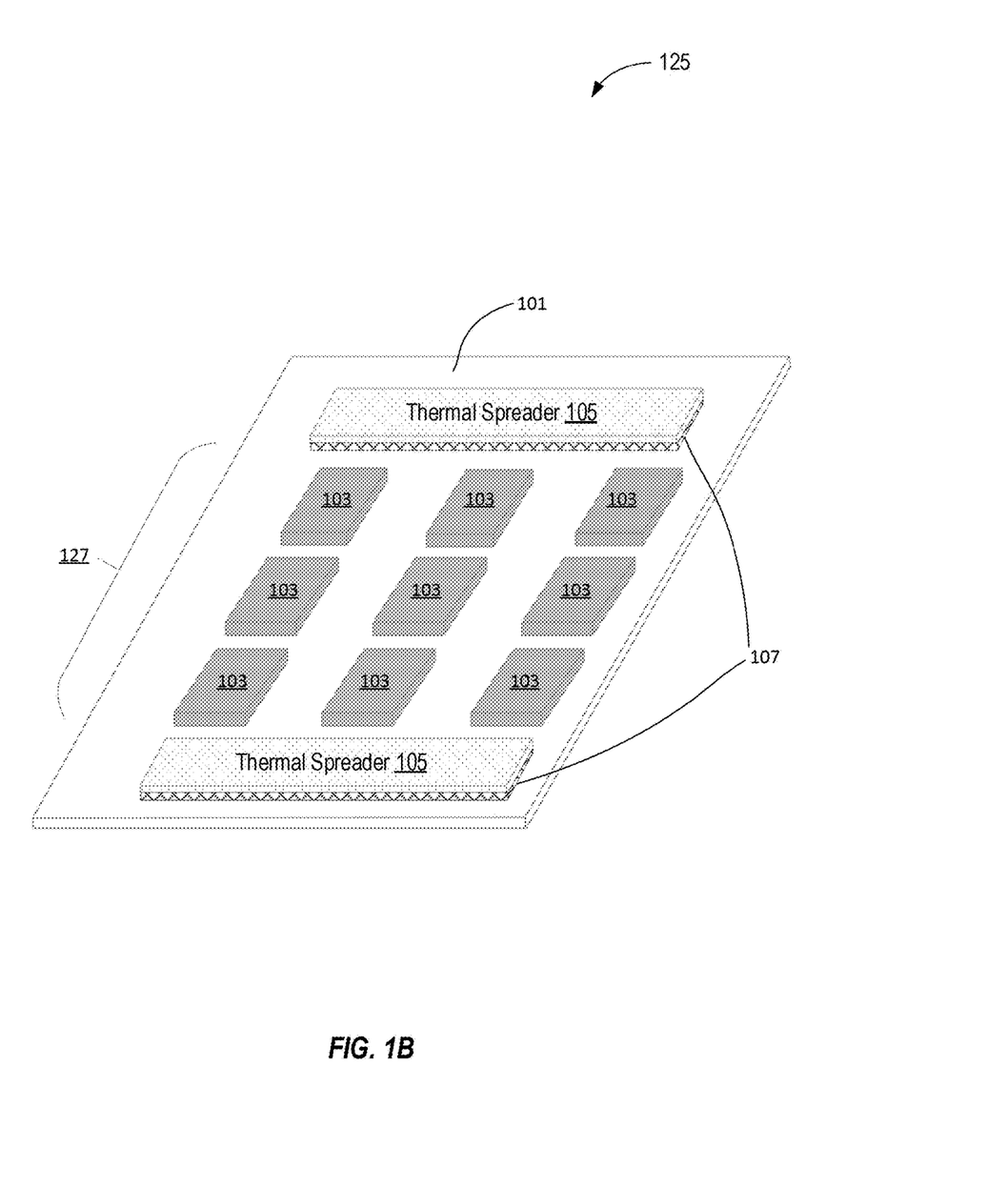

With regard now to FIG. 1B, one embodiment of a stacked semiconductor die architecture 125 is shown. The architecture 125 includes many of the same components as those described above in connection with the architecture 100 of FIG. 1. For brevity, these components are not described unless it is necessary for understanding the architecture 125 shown in FIG. 1B. Furthermore, only differences between the architecture 100 and the architecture 125 are described below in connection with FIG. 1B.

One difference between the architecture 125 of FIG. 1B and the architecture 100 that is described above in connection with FIG. 1A is that the architecture 125 has a different arrangement than the arrangement of the architecture 100. More specifically, the architecture 125 includes a base die 101 with multiple stacked semiconductor dies 103 on the base die 101. In the embodiment shown in FIG. 1B, the multiple stacked semiconductor dies 103 are clustered together to form a group 127 of stacked semiconductor dies 103. As used herein, "a group of stacked semiconductor dies" and its variations includes one or more stacked semiconductor dies. The group 127 of stacked semiconductor dies 103 may be arranged in a ring arrangement, a square arrangement, a rectangular arrangement, a polygonal arrangement, a mesh arrangement, or any other suitable arrangement. Furthermore, and for this embodiment, one or more thermal spreaders 105 are adjacent to the group 127 of stacked semiconductor dies 103. For a further embodiment, there are no thermal spreaders 105 between any two stacked semiconductor dies 103 in the group 127 of stacked semiconductor dies 103.

In the architecture 125, one or more thermal spreaders 105 may be disposed on one, two, three, four, or any number of sides of the base die 101. For a first example, and as shown in FIG. 1B, multiple thermal spreaders 105 are on two sides of the base die 101 and positioned adjacently to the group 127 of stacked semiconductor dies 103. For a second example, one or more thermal spreaders 105 are on one side of the base die 101 and positioned adjacently to the group 127 of stacked semiconductor dies 103. For a third example, one or more thermal spreaders 105 are on three sides of the base die 101 and positioned adjacently to the group 127 of stacked semiconductor dies 103. For a fourth example, one or more thermal spreaders 105 are on four sides of the base die 101 and positioned adjacently to the group 127 of stacked semiconductor dies 103. It is to be appreciated that more than one thermal spreader 105 may be placed on a single side of the base die 101.

For a specific embodiment, the thermal spreaders 105 surround the group 127 of stacked semiconductor dies 103. For a further embodiment, the thermal spreaders 105 surround the group 127 of stacked semiconductor dies 103 and there are no thermal spreaders 105 between any two stacked semiconductor dies 103 in the group 127 of stacked semiconductor dies 103.

In one embodiment of the architecture 125 shown in FIG. 1B, a surface area of the base die 101 is larger than surface areas of the stacked dies 103 and the thermal spreaders 105. In one embodiment, the base die 101, the group 127 of the stacked dies 103, and the one or more thermal spreaders 105 are electrically coupled to each other through electrical communication pathways (e.g., electrical traces, etc.). The base die 101 can be a monolithic base die or a plurality of disaggregated base dies.

Although not shown in FIG. 1B, the architecture 125 may include electrical connections between two or more of the thermal spreaders 105, the group 127 of the stacked semiconductor dies 103, and the base die 101. These electrical connections include, but are not limited to, interconnect structures (e.g., bumps, microbumps, pillars, wire bonds, etc.). These electrical connections may be formed from suitable materials known in the art of semiconductor fabrication (e.g., copper, palladium, aluminum, steel, nickel, any other metal, a metal alloy, any other conductive material, or any combination thereof, etc.).

It is to be appreciated that the arrangements described in connection with FIGS. 1A-1B may be combined. That is, and for one embodiment, a stacked semiconductor architecture for a semiconductor package may comprise: a base die; a plurality of stacked semiconductor dies on the base die; and a plurality of thermal spreaders on the base die, the plurality of thermal spreaders disposed on the base die in: (i) one or more gaps between the plurality of stacked semiconductor dies; and/or (ii) in one or more areas on the base die that are adjacent to the plurality of stacked semiconductor dies.

Furthermore, the dies discussed above in connection with FIGS. 1A-1B may have any suitable shape known in the art. For one example, the base die 101 may have any suitable shape known in the art. For another example, each of the stacked semiconductor dies 103 may have any suitable shape known in the art. For yet another example, two of more stacked semiconductor dies 103 in a group stacked semiconductor dies 103 may have different shapes from each other.

FIGS. 2A-2F are cross-sectional side view illustrations of stacked semiconductor architectures 200, 225, 250, 295, 297, and 299 that each include a plurality of stacked semiconductor dies 203A-B and a plurality of thermal spreaders 200, 225 on a base die 201, according to several embodiments. For brevity, the stacked semiconductor dies 203A-B, the base die 201, and the electrical connections 205 are not described in detail below in connection with FIGS. 2A-2C because similar components are described above in connection with one or more of FIGS. 1A-1B.

Figure 2A:
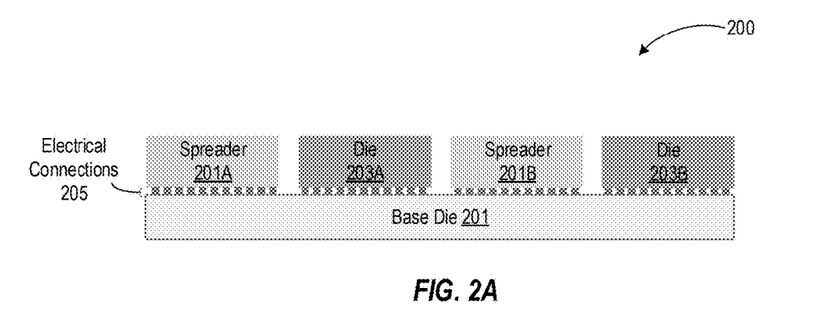
FIGS. 2A-2F are cross-sectional side view illustrations of stacked semiconductor architectures that include a plurality of stacked semiconductor dies and a plurality of thermal spreaders on a base die, according to several embodiments.

With regard now to FIG. 2A, a stacked semiconductor architecture 200 is shown. The architecture 200 includes a base die 201, multiple stacked dies 203A-B, multiple thermal spreaders 201A-B, and electrical connections 205 that couple the spreaders 201A-B and the stacked dies 203A-B to the base die 201. In one embodiment, each of the thermal spreaders 201A-B is formed from a suitable metal or metal alloy (e.g., copper, etc.). In one embodiment, at least one of the thermal spreaders 201A-B is a silicon semiconductor die.

Figure 2B:
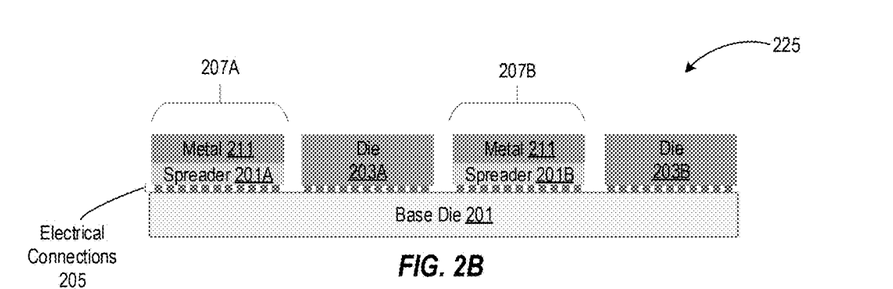

With regard now to FIG. 2B, a stacked semiconductor architecture 225 is shown. The architecture 225 includes a base die 201, multiple stacked dies 203A-B, multiple thermal spreaders 207A-B, and electrical connections 205 that couple the spreaders 207A-B and the stacked dies 203A-B to the base die 201. In one embodiment, each of the thermal spreaders 207A-B is formed from silicon and metal. For example, each of the thermal spreaders 207A-B is formed from one of the silicon semiconductor die 201A-Bs and one or more metal layers 211 on the respective one of the silicon semiconductor dies 201A-B. The metal layer(s) 211 can be formed from copper or any other suitable metal or metal alloy. In one embodiment, at least one of the thermal spreaders 207A-B is a silicon semiconductor die having one or more metal layers formed thereon. For example, at least one of the thermal spreaders 207A B may be a silicon die with multiple thick metal (e.g., copper, etc.) layers formed thereon. For a specific example, the metal layers can have a z-height of approximately 35 μm.

Figure 2C:
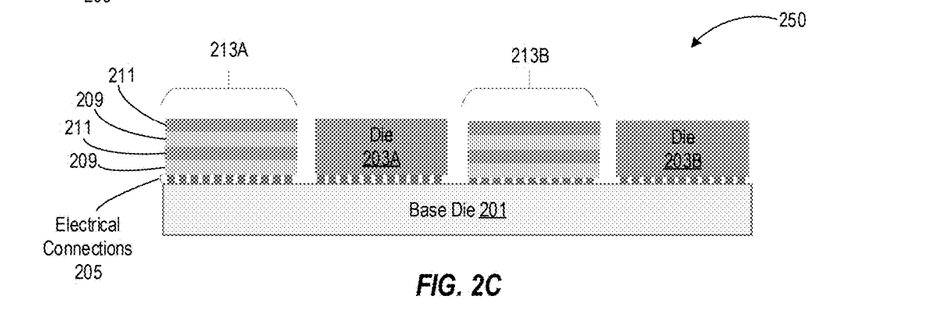

Referring now to FIG. 2C, a stacked semiconductor architecture 250 is shown. The architecture 250 includes a base die 201, multiple stacked dies 203A-B, multiple thermal spreaders 213A-B, and electrical connections 205 that couple the spreaders 213A-B and the stacked dies 203A-B to the base die 201. In one embodiment, each of the thermal spreaders 213A-B is formed from multiple interleaved layers comprising: (i) one or more dielectric layers 209; and (ii) one or more metal layers 211. For example, each of the thermal spreaders 213A-B is formed from a first dielectric layer 209, a first metal layer 211 on the first dielectric layer 209, a second dielectric layer 209 on the first metal layer 211, and a second metal layer 211 on the second dielectric layer 209. The metal layers 211 can be formed from copper or any other suitable metal or metal alloy. Each of the dielectric layers 209 in the thermal spreaders 213A-B may be formed from any suitable dielectric material as is known in the art. Dielectric materials include, but are not limited to, one or more of the following: high-k dielectrics and low-k dielectrics, where k is the dielectric constant of a material. Examples of dielectrics are nanopourous silica, hydrogen-silsesquioxanes (HSQ), teflon-AF (Polytetrafluoethylene or PTFE), silicon oxyflouride (FSG), etc. Dielectric materials may be silicon based. Dielectric material may also include, but is not limited to, one or more of silicon dioxide and silicon nitride.

Figure 2D:
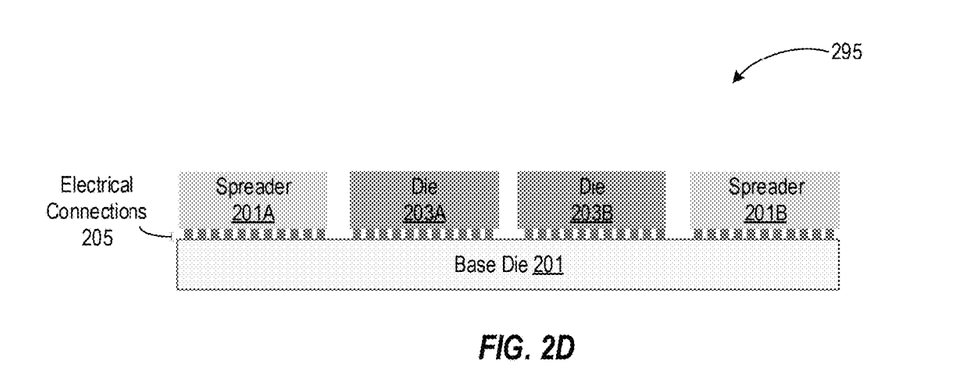

With regard now to FIG. 2D, which illustrates a stacked semiconductor architecture 295 is shown. The architecture 295 includes a base die 201, multiple stacked dies 203A-B, multiple thermal spreaders 201A-B, and electrical connections 205 that couple the spreaders 201A-B and the stacked dies 203A-B to the base die 201. In one embodiment, each of the thermal spreaders 201A-B is formed from a suitable metal or metal alloy (e.g., copper, etc.). In one embodiment, at least one of the thermal spreaders 201A-B is a silicon semiconductor die.

Figure 2E:
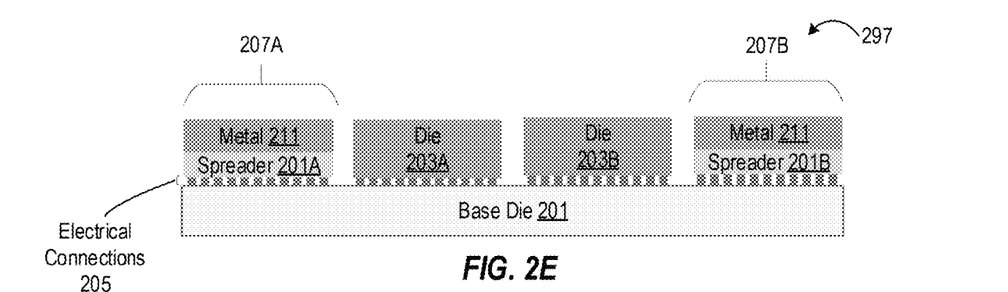

With regard now to FIG. 2E, a stacked semiconductor architecture 297 is shown. The architecture 297 includes a base die 201, multiple stacked dies 203A-B, multiple thermal spreaders 207A-B, and electrical connections 205 that couple the spreaders 207A-B and the stacked dies 203A-B to the base die 201. In one embodiment, each of the thermal spreaders 207A-B is formed from silicon and metal. For example, each of the thermal spreaders 207A-B is formed from one of the silicon semiconductor die 201A-Bs and one or more metal layers 211 on the respective one of the silicon semiconductor dies 201A-B. The metal layer(s) 211 can be formed from copper or any other suitable metal or metal alloy. In one embodiment, at least one of the thermal spreaders 207A-B is a silicon semiconductor die having one or more metal layers formed thereon. For example, at least one of the thermal spreaders 207A B may be a silicon die with multiple thick metal (e.g., copper, etc.) layers formed thereon. For a specific example, the metal layers can have a z-height of approximately 35 μm.

Figure 2F:
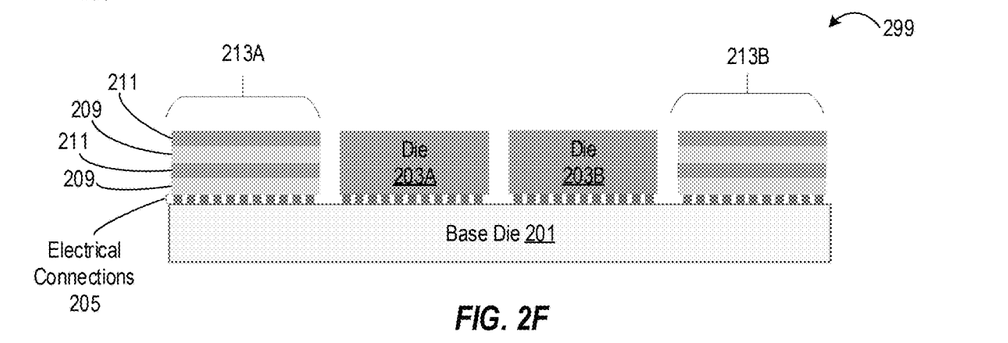

Referring now to FIG. 2F, a stacked semiconductor architecture 299 is shown. The architecture 299 includes a base die 201, multiple stacked dies 203A-B, multiple thermal spreaders 213A-B, and electrical connections 205 that couple the spreaders 213A-B and the stacked dies 203A-B to the base die 201. In one embodiment, each of the thermal spreaders 213A-B is formed from multiple interleaved layers comprising: (i) one or more dielectric layers 209; and (ii) one or more metal layers 211. For example, each of the thermal spreaders 213A-B is formed from a first dielectric layer 209, a first metal layer 211 on the first dielectric layer 209, a second dielectric layer 209 on the first metal layer 211, and a second metal layer 211 on the second dielectric layer 209. The metal layers 211 can be formed from copper or any other suitable metal or metal alloy. Each of the dielectric layers 209 in the thermal spreaders 213A-B may be formed from any suitable dielectric material as described above in connection with FIG. 2C.

In some embodiments of the stacked semiconductor die architectures shown in FIGS. 2A-2F, top and/or bottom sides of the semiconductor dies 203A-B may be co planar with top and/or bottom sides of the thermal spreaders 201A-B, 207A-B, and 213A-B, respectively. Furthermore, electrical connections 205 may be formed from interconnect structures (e.g., bumps, microbumps, pillars, wire bonds, etc.) and used to couple the base die 201 to the semiconductor dies 203A-B and/or the thermal spreaders 201A-B, 207A-B, and 213A-B.

It is to be appreciated that the arrangements described in connection with FIGS. 2A-2F may be combined. That is, and for one embodiment, a stacked semiconductor architecture for a semiconductor package may comprise: a base die; a plurality of stacked semiconductor dies on the base die; and a plurality of thermal spreaders on the base die, the plurality of thermal spreaders disposed on the base die in: (i) one or more gaps between the plurality of stacked semiconductor dies; and/or (ii) in one or more areas on the base die that are adjacent to the plurality of stacked semiconductor dies.

Furthermore, the dies discussed above in connection with FIGS. 2A-2F may have any suitable shape known in the art. For one example, the base die 201 may have any suitable shape known in the art. For another example, each of the stacked semiconductor dies 203A-B may have any suitable shape known in the art. For yet another example, two of more stacked semiconductor dies 203A-B in a group stacked semiconductor dies 203A-B may have different shapes from each other.

Figure 3A:
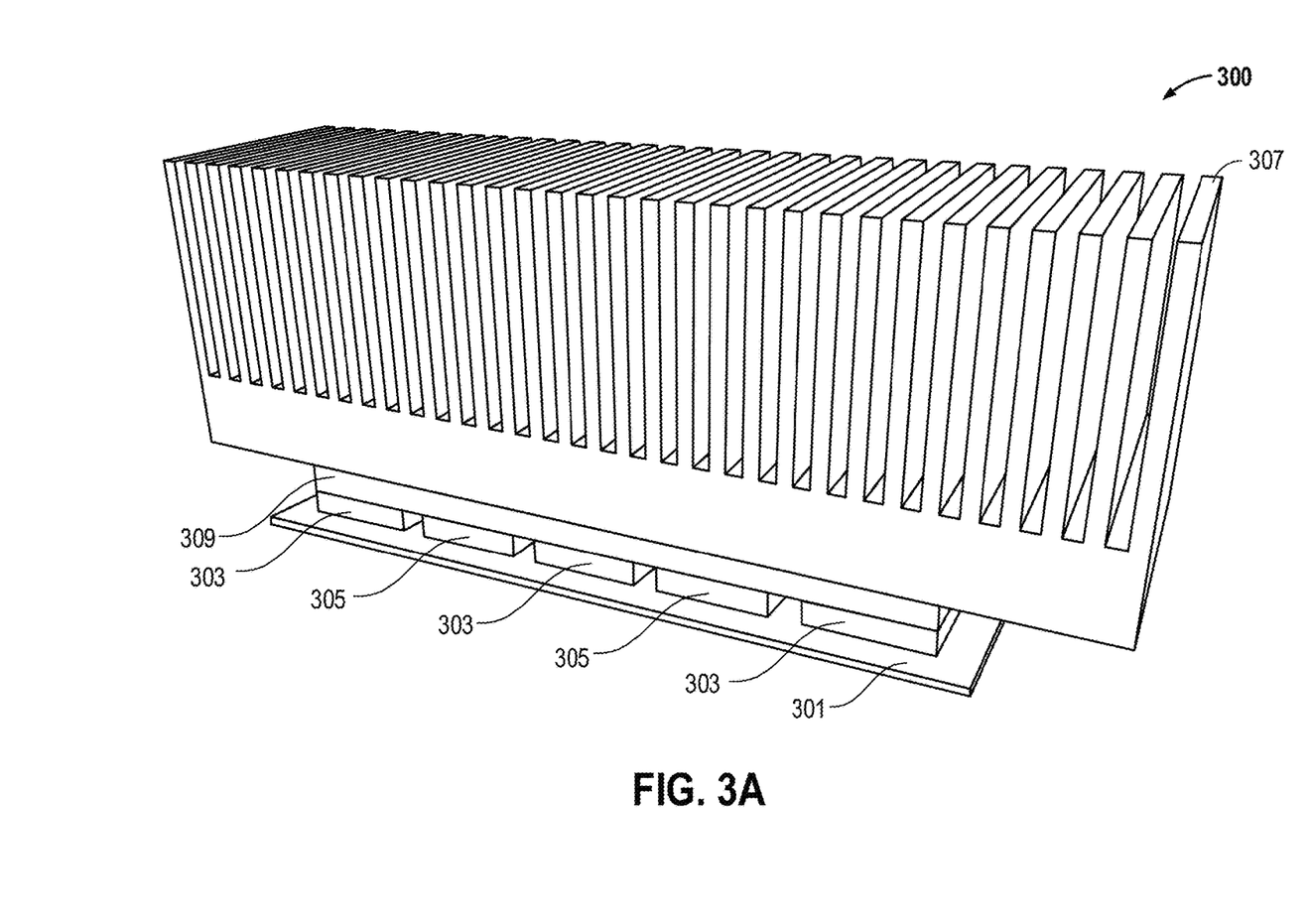
FIGS. 3A-3B are isometric views of stacked semiconductor architectures that includes a plurality of stacked semiconductor dies on a base die, a plurality of thermal spreaders on the base die, and a heat sink, according to one or more embodiments.

Reference is now made to FIG. 3A, an isometric view of a stacked semiconductor architecture 300 is shown. The architecture 300 includes a plurality of stacked semiconductor dies 303 on a base die 301, a plurality of thermal spreaders 305 on the base die 301, and a heat sink 307, according to one embodiment. For brevity, the stacked semiconductor dies 303, the base die 301, and the thermal spreaders 305 are not described in detail below in connection with FIG. 3A because similar components are described above in connection with FIGS. 1 and 2A-2C. In one embodiment, the architecture 300 includes an arrangement of the plurality of stacked semiconductor dies 303 and the plurality of thermal spreaders 305 on the base die 301 that is similar to or the same as the arrangement of the plurality of stacked semiconductor dies 103 and the plurality of thermal spreaders 105 on the base die 101 that is shown and described above in connection with the architecture 100 of FIG. 1A. For example, and as shown in FIG. 3A, the architecture 300 includes an arrangement of the plurality of stacked semiconductor dies 303 and the plurality of thermal spreaders 305 on the base die 301 that comprises a thermal spreader 305 placed in a gap between two of the stacked semiconductor dies 303.

As shown in FIG. 3A, a heat sink 307 is in contact with one or more of the thermal spreaders 305 and the stacked semiconductor dies 303 to assist with thermal management, which can in turn assist with dissipation of heat from dies 301, 303, and the spreaders 305 to assist with improving power density. In one embodiment, the thermal spreaders 305 provide a lateral thermally conductive path and a larger interface to the heat sink 307. The thermal interface resistance from the dies 301, 305 to the heat sink 307 is approximately 20% to 60% of the total thermal resistance (junction to ambient). The heat sink 307 can be formed from any suitable material known in the art of heat sinks. Examples of materials used for forming heat sinks include, but are not limited to, aluminum, copper, diamond, aluminum alloys, copper-tungsten alloys, silicon carbide, Dymalloy, E-material, and any other metal or metal alloy used in the art of heat sinks. The heat sink 307 can include fins, as is shown in FIG. 3A. For example, the heat sink 307 can include pin fins, straight fins, flared fins, any other type of fins known in the art of heat sinks, or any combination thereof.

In one embodiment, a thermal interface material (TIM) layer 309 is between: (i) the heat sink 307; and (ii) top sides of the stacked semiconductor dies 303 and the thermal spreaders 305. The TIM layer 309 can be used to facilitate thermal conduction from a component (e.g., stacked semiconductor dies 303, thermal spreaders 305, etc.) to a secondary heat exchanger (e.g., a heat sink 307, an ambient environment, other secondary heat exchangers, etc.). The TIM layer 309 can assist with minimizing interface thermal resistance. The TIM layer 309 can be formed from a material that exhibits high thermal conductivity. Such materials may include high thermal conductivity materials that become liquidous or near-liquidous at predetermined operating temperatures. The TIM layer 309 may be designed to flow and fill surface asperities enabling reductions in thermal resistance between (i) the heat sink 307; and (ii) the stacked semiconductor dies 303 and the thermal spreaders 305. The materials used to make at the TIM layer 309 can be at least one of a metal based TIM, a polymer matrix TIM, thermal grease, or any other TIM-1 material layer known in the art.

The TIM layer 309 can be a metallic alloy with a low melting point. The TIM layer 309 can be a solder thermal interface material ("STIM"), such as an indium solder TIM. In one embodiment, the TIM layer 309 is a metal based alloy layer. For example, the TIM layer 309 includes at least one of indium, tin, lead, silver, antimony, bismuth, zinc, cadmium, gold, copper, ruthenium, nickel, cobalt, chromium, iron, manganese, titanium, aluminum, hafnium, tantalum, tungsten, vanadium, molybdenum, palladium, platinum, or any combination thereof. The TIM layer 309 may include at least one of a polymeric thermal interface material (PTIM), an epoxy, a liquid phase sintering (LPS) paste, or a solder paste. In one embodiment, the TIM layer 309 can include thermal grease, which allows for a very thin bond line and therefore a very small thermal resistance. In one embodiment, the TIM layer 309 can include thermal glue, which also allows a very thin bond line and provides some mechanical strength to the bond after curing. Thermal glue allows thicker bond line than the thermal grease as it cures. In one embodiment, the TIM layer 309 can include a thermal gap filler, which allows thicker bond lines than the thermal grease as it cures while still allowing an easy disassembly thanks to limited adhesiveness. In one embodiment, the TIM layer 309 can include a thermal pad, which is mostly made of silicone or silicone-like material. A thermal pad can allow for thicker bond lines but will usually need higher force to press the heat sink on the heat source (i.e., the stacked semiconductor dies 303, the base die 301, and the thermal spreaders 305, etc.) so that the thermal pad conform to the bonded surfaces. In one embodiment, the TIM layer 309 can include a thermal adhesive, which is a thermal pad with adhesive properties. In one embodiment, the TIM layer 309 can include a thermal tapes, which adhere to surfaces of components or materials, require no curing time and are easy to apply.

In one embodiment, the TIM layer 309 and the thermal spreaders 305 could assist with reducing or eliminating interface thermal resistance between dies 301, 303 and the heat sink 307. For example, the thermal spreaders 305 and the TIM layer could assist with halving the interface thermal resistance between dies 301, 303 and the heat sink 307. Lowering the interface thermal resistance can assist with enabling higher thermal design power, which can assist with enabling higher performance and power density.

In one embodiment, the heat sink 307 can be coupled to the base die 301 via electrically conductive connections. Examples of such electrically conductive connections include, but are not limited to, interconnect structures (e.g., bumps, microbumps, pillars, wire bonds, etc.). The heat sink 307 can assist with providing an electrical spreading function for the stacked semiconductor die architecture 300. The heat sink 307 may also be patterned to include a set of inductors for power conversion (e.g., DC to DC conversion, etc.).

Figure 3B:
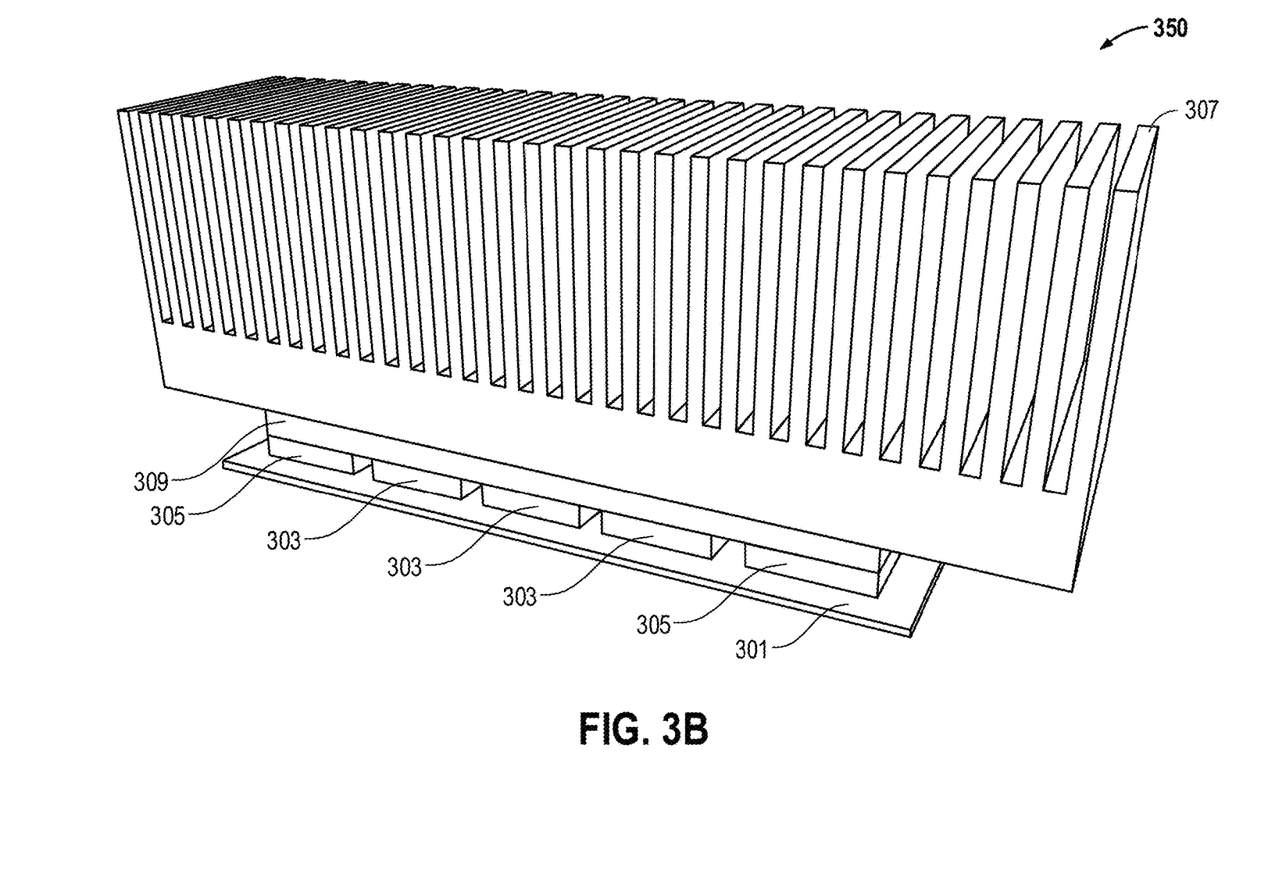

With regard now to FIG. 3B, an isometric view of a stacked semiconductor architecture 350 is shown. The architecture 350 includes a plurality of stacked semiconductor dies 303 on a base die 301, a plurality of thermal spreaders 305 on the base die 301, and a heat sink 307, according to one embodiment. The architecture 350 of FIG. 3B includes many of the same components as those described above in connection with the architecture 300 of FIG. 3A. For brevity, the stacked semiconductor dies 303, the base die 301, and the thermal spreaders 305 are not described in detail below in connection with FIG. 3B because similar components are described above in connection with FIG. 3A. Furthermore, only differences between the architecture 350 of FIG. 3B and the architecture 300 described above in connection with FIG. 3A are described below in connection with FIG. 3B.

One difference between the architecture 350 of FIG. 3B and the architecture 300 described above in connection with FIG. 3A relates to the arrangement of the dies 303 and the spreaders 305. In FIG. 3A, the architecture 300 has an arrangement of the stacked semiconductor dies 303 and the thermal spreaders 305 on the base die 301 that is similar to the arrangement described above in connection with FIG. 1A. In FIG. 3B, the architecture 350 has an arrangement of the stacked semiconductor dies 303 and the thermal spreaders 305 on the base die 301 that is similar to the arrangement described above in connection with FIG. 1B. More specifically, the architecture 350 includes an arrangement of the plurality of stacked semiconductor dies 303 and the plurality of thermal spreaders 305 on the base die 301 that is similar to or the same as the arrangement of the plurality of stacked semiconductor dies 103 and the plurality of thermal spreaders 105 on the base die 101 that is shown and described above in connection with the architecture 125 of FIG. 1B. For example, and as shown in FIG. 3B, the architecture 350 includes an arrangement of the plurality of stacked semiconductor dies 303 and the plurality of thermal spreaders 305 on the base die 301 that comprises a thermal spreader 305 placed in an area on the base die 301 that is adjacent to a group of the stacked semiconductor dies 303.

It is to be appreciated that the arrangements described in connection with FIGS. 3A-3B may be combined. That is, and for one embodiment, a stacked semiconductor architecture for a semiconductor package may comprise: a base die; a plurality of stacked semiconductor dies on the base die; and a plurality of thermal spreaders on the base die, the plurality of thermal spreaders disposed on the base die in: (i) one or more gaps between the plurality of stacked semiconductor dies; and/or (ii) in one or more areas on the base die that are adjacent to the plurality of stacked semiconductor dies.

Furthermore, the dies discussed above in connection with FIGS. 3A-3B may have any suitable shape known in the art. For one example, the base die 301 may have any suitable shape known in the art. For another example, each of the stacked semiconductor dies 303 may have any suitable shape known in the art. For yet another example, two of more stacked semiconductor dies 303 in a group stacked semiconductor dies 303 may have different shapes from each other.

Figure 4A:
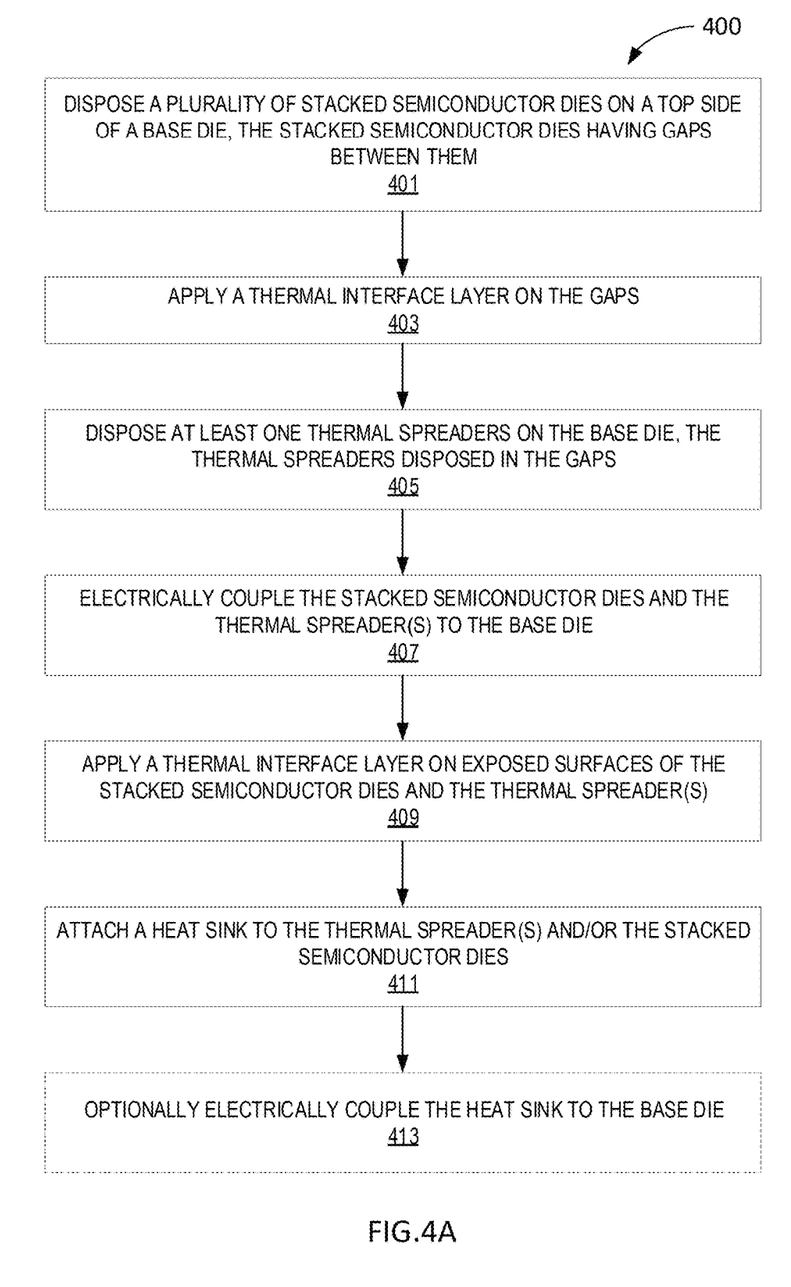
FIGS. 4A-4B are process flow illustrations of methods of building a stacked semiconductor architecture that includes a plurality of stacked semiconductor dies and a plurality of thermal spreaders on a base die, according to one or more embodiments.

FIG. 4A is a process flow illustration of a method 400 of building a stacked semiconductor architecture that includes a plurality of stacked semiconductor dies and a plurality of thermal spreaders on a base die, according to one embodiment. The method 400 begins at block 401, where a plurality of stacked semiconductor dies are mounted on a base die. The plurality of stacked semiconductor dies are arranged on the base die in a way that provides gaps between the stacked semiconductor dies. In one embodiment, the mounting of the stacked semiconductor dies on the dies is performed in accord with the descriptions provided above in connection with at least one of FIGS. 1A-3B. In one embodiment, the method 400 also includes block 403. Here, a TIM layer (e.g., thermally conductive tape, etc.) can be applied on the base die in the gaps between the stacked semiconductor dies. TIM layers are described above in connection with at least FIG. 3A.

Next, the method 400 proceeds to block 405. Here, at least one thermal spreader is mounted on the base die in the gaps between the stacked semiconductor dies. More specifically, the thermal spreader(s) are mounted on the TIM layer in the gaps between the stacked semiconductor dies. At block 407, the stacked semiconductor dies and the thermal spreaders are electrically coupled to the base die via electrical connections (e.g., interconnect structures, microbumps, bumps, pillars, etc.). The method 400 proceeds to block 409. At this point, another TIM layer (e.g., thermal glue, thermal grease, etc.) can be applied onto exposed surfaces of the stacked semiconductor dies and/or the thermal spreader(s). At block 411, a heat sink is attached to the exposed surfaces of the stacked semiconductor dies and/or the thermal spreader(s). For one embodiment, the TIM layer on the exposed surfaces of the stacked semiconductor dies and/or the thermal spreader(s) assists with securing the heat sink to the stacked semiconductor dies and/or the thermal spreader(s).

The method 400 can also include an optional step 413. Here, the heat sink is electrically coupled to the base die. These connections can be similar to or the same as the electrical connections 205 described above in connection with at least FIGS. 1-2F. Examples of such electrical connections can include, but are not limited to, wire bond interconnects.

Figure 4B:
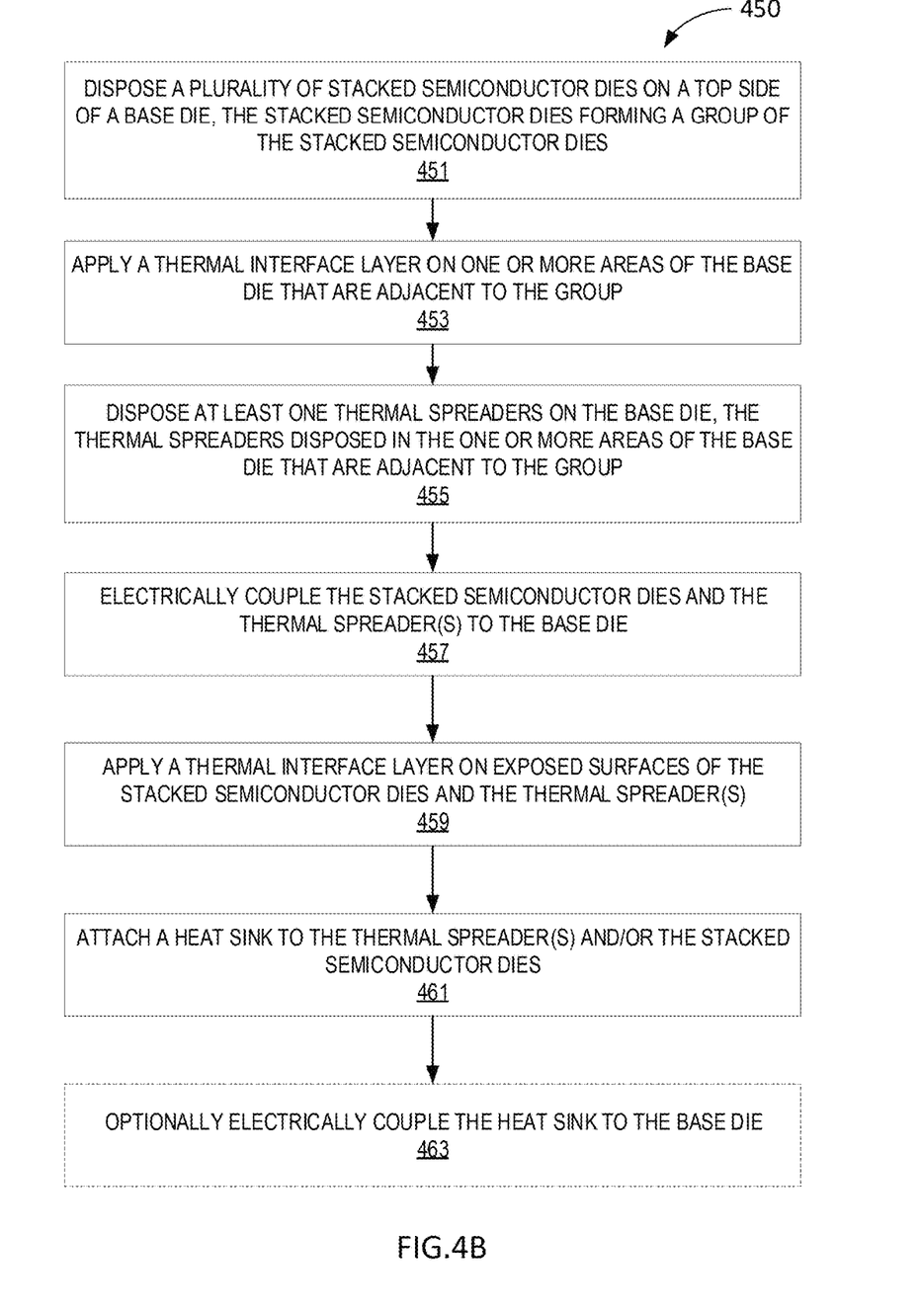

FIG. 4B is a process flow illustration of a method 450 of building a stacked semiconductor architecture that includes a plurality of stacked semiconductor dies and a plurality of thermal spreaders on a base die, according to one embodiment. The method 450 begins at block 451, where a plurality of stacked semiconductor dies are mounted on a base die. The plurality of stacked semiconductor dies are arranged on the base die in a way that forms a group of the stacked semiconductor dies. In one embodiment, the mounting of the stacked semiconductor dies on the dies is performed in accord with the descriptions provided above in connection with at least one of FIGS. 1A-3B. In one embodiment, the method 450 also includes block 453. Here, a TIM layer (e.g., thermally conductive tape, etc.) can be applied to one or more areas of the base die that are adjacent to the group of stacked semiconductor dies. TIM layers are described above in connection with at least FIG. 3A.

Next, the method 450 proceeds to block 455. Here, at least one thermal spreader is mounted on the base die in one or more areas that are adjacent to the group of stacked semiconductor dies. For a specific embodiment, the thermal spreader(s) are mounted on the TIM layer such that no thermal spreader is disposed between any two stacked semiconductor dies from the group of stacked semiconductor dies. At block 457, the stacked semiconductor dies and the thermal spreaders are electrically coupled to the base die via electrical connections (e.g., interconnect structures, microbumps, bumps, pillars, etc.). The method 450 proceeds to block 459. At this point, another TIM layer (e.g., thermal glue, thermal grease, etc.) can be applied onto exposed surfaces of the stacked semiconductor dies and/or the thermal spreader(s). At block 451, a heat sink is attached to the exposed surfaces of the stacked semiconductor dies and/or the thermal spreader(s). For one embodiment, the TIM layer on the exposed surfaces of the stacked semiconductor dies and/or the thermal spreader(s) assists with securing the heat sink to the stacked semiconductor dies and/or the thermal spreader(s).

The method 450 can also include an optional step 453. Here, the heat sink is electrically coupled to the base die. These connections can be similar to or the same as the electrical connections 205 described above in connection with at least FIGS. 1-2F. Examples of such electrical connections can include, but are not limited to, wire bond interconnects.

It is to be appreciated that the arrangements described in connection with FIGS. 4A-4B may be combined. That is, and for one embodiment, a stacked semiconductor architecture for a semiconductor package may comprise: a base die; a plurality of stacked semiconductor dies on the base die; and a plurality of thermal spreaders on the base die, the plurality of thermal spreaders disposed on the base die in: (i) one or more gaps between the plurality of stacked semiconductor dies; and/or (ii) in one or more areas on the base die that are adjacent to the plurality of stacked semiconductor dies.

Furthermore, the dies discussed above in connection with FIGS. 4A-4B may have any suitable shape known in the art. For one example, the base die may have any suitable shape known in the art. For another example, each of the stacked semiconductor dies may have any suitable shape known in the art. For yet another example, two of more stacked semiconductor dies in a group stacked semiconductor dies may have different shapes from each other.

Figure 5:
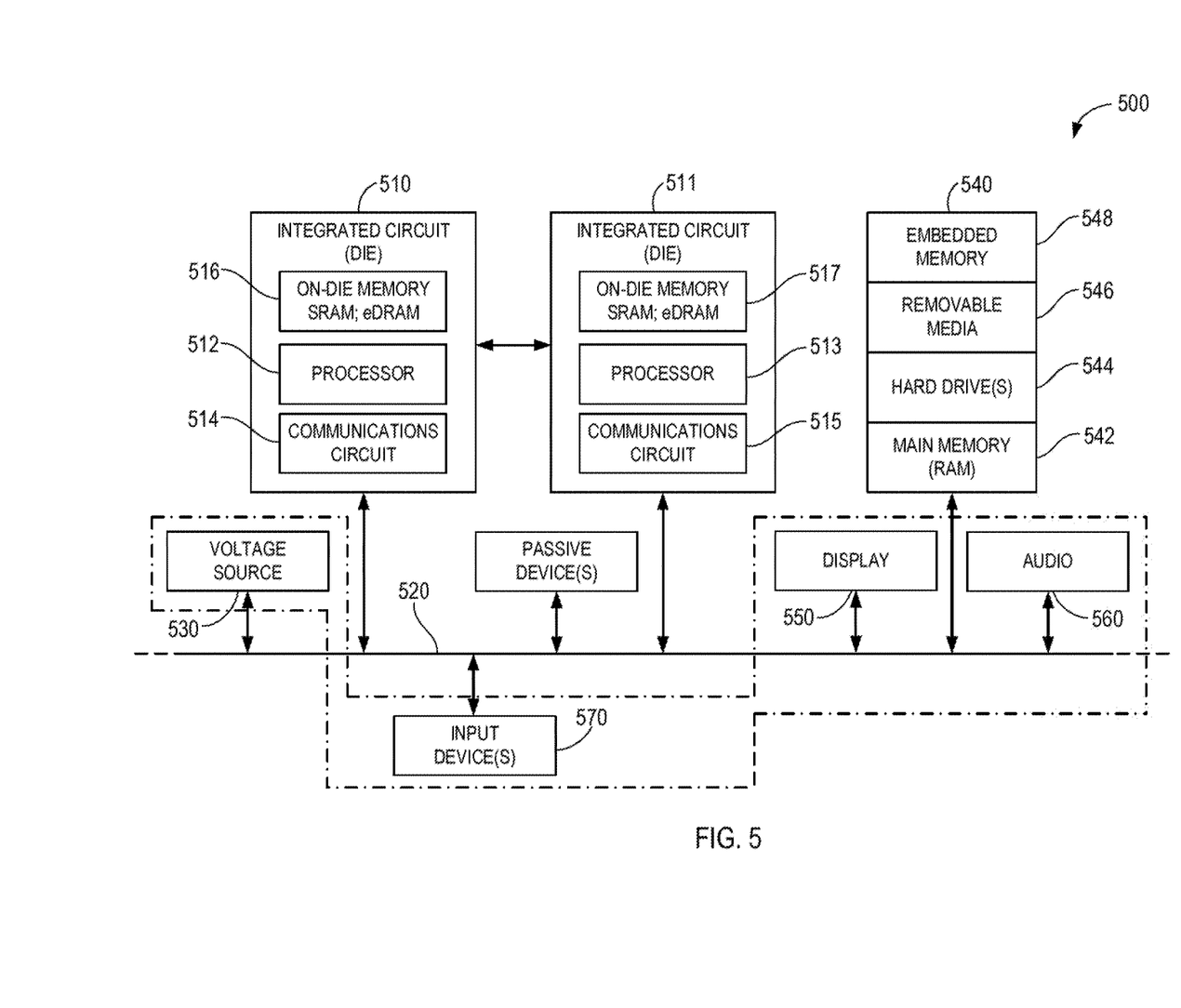
FIG. 5 is an illustration of a schematic block diagram of a computer system that utilizes a semiconductor package having a stacked semiconductor architecture, according to an embodiment.

FIG. 5 illustrates a schematic of a computer system 500 according to an embodiment. The computer system 500 (also referred to as an electronic system 500) can include a semiconductor package that includes a stacked semiconductor die architecture in accord with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The electronic system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. For an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. For an embodiment, the processor 512 includes, or is coupled with, a semiconductor package that includes a stacked semiconductor die architecture in accord with any of the embodiments and their equivalents, as described in the foregoing specification. For an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. For an embodiment, the integrated circuit 510 includes on-die memory 516 such as static random-access memory (SRAM). For an embodiment, the integrated circuit 510 includes embedded on-die memory 516 such as embedded dynamic random-access memory (eDRAM). In one embodiment, the on-die memory 516 may be packaged with a process in accord with any of the embodiments and their equivalents, as described in the foregoing specification.

For an embodiment, the integrated circuit 510 is complemented with a subsequent integrated circuit 511. Useful embodiments include a dual processor 513 and a dual communications circuit 515 and dual on-die memory 517 such as SRAM. For an embodiment, the dual integrated circuit 510 includes embedded on-die memory 517 such as eDRAM.

For an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

For an embodiment, the electronic system 500 also includes a display device 550 and an audio output 560. For an embodiment, the electronic system 500 includes an input device such as a controller 570 that may be a keyboard, mouse, trackball, game controller, microphone, voice-recognition device, or any other input device that inputs information into the electronic system 500. For an embodiment, an input device 570 is a camera. For an embodiment, an input device 570 is a digital sound recorder. For an embodiment, an input device 570 is a camera and a digital sound recorder.

At least one of the integrated circuits 510 or 511 can be implemented in a number of different embodiments, including a semiconductor package that includes a stacked semiconductor die architecture as described herein, an electronic system, a computer system, one or more methods of fabricating an integrated circuit, and one or more methods of fabricating an electronic assembly that includes a semiconductor package that includes a stacked semiconductor die architecture, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embodiments as set forth herein and their art-recognized equivalents. A foundation substrate may be included, as represented by the dashed line of FIG. 5. Passive devices may also be included, as is also depicted in FIG. 5.

It is to be appreciated that two or more of the embodiments described in the foregoing specification and figures may be combined. Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments set forth in the foregoing specification may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a stacked semiconductor architecture for a semiconductor package, comprising: a base die; a plurality of stacked semiconductor dies on the base die; and a plurality of thermal spreaders on the base die, the plurality of thermal spreaders disposed on the base die in one or more gaps between the plurality of stacked semiconductor dies or in one or more areas on the base die that are adjacent to the plurality of stacked semiconductor dies.

Additional embodiments include a stacked semiconductor architecture for a semiconductor package, further comprising electrical connections between two or more of the base die, the plurality of stacked semiconductor dies, and the plurality of thermal spreaders.

Additional embodiments include a stacked semiconductor architecture for a semiconductor package, further comprising a heat sink disposed on exposed surfaces of the plurality of stacked semiconductor dies and the plurality of thermal spreaders.

Additional embodiments include a stacked semiconductor architecture for a semiconductor package, wherein at least one thermal interface material (TIM) layer is disposed between: (i) the heat sink; and (ii) the plurality of stacked semiconductor dies and the plurality of thermal spreaders.

Additional embodiments include a stacked semiconductor architecture for a semiconductor package, wherein the heat sink is electrically coupled to the base die.

Additional embodiments include a stacked semiconductor architecture for a semiconductor package, wherein at least one of the thermal spreaders is formed from a metal or a metal alloy.

Additional embodiments include a stacked semiconductor architecture for a semiconductor package, wherein at least one of the thermal spreaders includes a silicon semiconductor die.

Additional embodiments include a stacked semiconductor architecture for a semiconductor package, wherein at least one of the thermal spreaders is formed from silicon (e.g., a silicon semiconductor die, etc.) with one or more metal layers formed thereon.

Additional embodiments include a stacked semiconductor architecture for a semiconductor package, wherein at least one of the thermal spreaders is formed from a plurality of interleaved layers comprising: (i) one or more dielectric layers; and (ii) one or more metal layers.

Embodiments described herein include a method of forming a stacked semiconductor architecture for a semiconductor package, comprising: disposing a plurality of stacked semiconductor dies on a base die; disposing a plurality of thermal spreaders on the base die, the plurality of thermal spreaders arranged on the base die in one or more gaps between the plurality of stacked semiconductor dies or in one or more areas on the base die that are adjacent to the plurality of stacked semiconductor dies; and electrically coupling the base die to the plurality of stacked semiconductor dies and the plurality of thermal spreaders.

Additional embodiments include a method, further comprising: applying a thermal interface material (TIM) layer on the base die in the one or more gaps or in the one or more areas on the base die that are adjacent to the plurality of stacked semiconductor dies prior to disposing the plurality of thermal spreaders on the base die.

Additional embodiments include a method, further comprising: applying a thermal interface material (TIM) layer on exposed surfaces of the plurality of stacked semiconductor dies and the plurality of thermal spreaders.

Additional embodiments include a method, further comprising: disposing a heat sink on exposed surfaces of the plurality of stacked semiconductor dies and exposed surfaces of the plurality of thermal spreaders.

Additional embodiments include a method, further comprising: electrically coupling the heat sink to the base die.

Additional embodiments include a method, wherein at least one of the thermal spreaders is formed from a metal or a metal alloy.

Additional embodiments include a method, wherein at least one of the thermal spreaders includes a silicon semiconductor die.

Additional embodiments include a method, wherein at least one of the thermal spreaders is formed from silicon (e.g., a silicon semiconductor die, etc.) with one or more metal layers formed thereon.

Additional embodiments include a method, wherein at least one of the thermal spreaders is formed from a plurality of interleaved layers comprising: (i) one or more dielectric layers and (ii) one or more metal layers.

Embodiments described herein include a semiconductor package, comprising: a base die; a plurality of stacked semiconductor dies on the base die; a plurality of thermal spreaders on the base die, the plurality of thermal spreaders disposed in one or more gaps between the plurality of stacked semiconductor dies or in one or more areas on the base die that are adjacent to the plurality of stacked semiconductor dies.

Additional embodiments include a semiconductor package, further comprising electrical connections between two or more of the base die, the plurality of stacked semiconductor dies, and the plurality of thermal spreaders.

Additional embodiments include a semiconductor package, further comprising a heat sink disposed on exposed surfaces of the plurality of stacked semiconductor dies and exposed surfaces of the plurality of thermal spreaders.

Additional embodiments include a semiconductor package, wherein a thermal interface material (TIM) layer is disposed between: (i) the heat sink; and (ii) the plurality of stacked semiconductor dies and the plurality of thermal spreaders.

Additional embodiments include a semiconductor package, wherein the heat sink is electrically coupled to the base die.

Additional embodiments include a semiconductor package, wherein at least one of the thermal spreaders is formed from a metal or a metal alloy.

Additional embodiments include a semiconductor package, wherein at least one of the thermal spreaders includes a silicon semiconductor die.

Additional embodiments include a semiconductor package, wherein at least one of the thermal spreaders is formed from silicon (e.g., a silicon semiconductor die, etc.) with one or more metal layers formed thereon.

Additional embodiments include a semiconductor package, wherein at least one of the thermal spreaders is formed from a plurality of interleaved layers comprising: (i) one o more dielectric layers and (i) one or more metal layers.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For a first example, the phrase "A or B" will be understood to include the possibilities of "A" or "B" or "A and B." For a second example, the phrase "A and B" will be understood to include the possibilities of "A" or "B" or "A and B." For a third example, the phrase "A and/or B" will be understood to include the possibilities of "A" or "B" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A stacked semiconductor architecture for a semiconductor package, comprising:
    a base die;
    a plurality of stacked semiconductor dies on the base die;
    a plurality of thermal spreaders on the base die, the plurality of thermal spreaders disposed on the base die in one or more gaps between the plurality of stacked semiconductor dies or in one or more areas on the base die that are adjacent to the plurality of stacked semiconductor dies; and
    a heat sink disposed on exposed surfaces of the plurality of stacked semiconductor dies and the plurality of thermal spreaders, wherein the heat sink is electrically coupled to the base die.

2. The stacked semiconductor architecture of claim 1, further comprising electrical connections between two or more of the base die, the plurality of stacked semiconductor dies, and the plurality of thermal spreaders.

3. The stacked semiconductor architecture of claim 1, further comprising a heat sink disposed on exposed surfaces of the plurality of stacked semiconductor dies and the plurality of thermal spreaders.

4. The stacked semiconductor architecture of claim 3, wherein a thermal interface material (TIM) layer is disposed between: (i) the heat sink; and (ii) the plurality of stacked semiconductor dies and the plurality of thermal spreaders.

5. The stacked semiconductor architecture of claim 1, wherein at least one of the thermal spreaders is formed from a metal or a metal alloy.

6. The stacked semiconductor architecture of claim 1, wherein at least one of the thermal spreaders includes a silicon semiconductor die.

7. The stacked semiconductor architecture of claim 1, wherein at least one of the thermal spreaders is formed from a silicon semiconductor die with one or more metal layers formed thereon.

8. A stacked semiconductor architecture for a semiconductor package, comprising:
    a base die;
    a plurality of stacked semiconductor dies on the base die; and
    a plurality of thermal spreaders on the base die, the plurality of thermal spreaders disposed on the base die in one or more gaps between the plurality of stacked semiconductor dies or in one or more areas on the base die that are adjacent to the plurality of stacked semiconductor dies, wherein at least one of the thermal spreaders is formed from a plurality of interleaved dielectric and metal layers.

9. A method of forming a stacked semiconductor architecture for a semiconductor package, comprising:
    disposing a plurality of stacked semiconductor dies on a base die;
    disposing a plurality of thermal spreaders on the base die, the plurality of thermal spreaders arranged on the base die in one or more gaps between the plurality of stacked semiconductor dies or in one or more areas on the base die that are adjacent to the plurality of stacked semiconductor dies; and
    electrically coupling the base die to the plurality of stacked semiconductor dies and the plurality of thermal spreaders.

10. The method of claim 9, further comprising:
    applying a thermal interface material (TIM) layer on the base die in the one or more gaps or in the one or more areas on the base die that are adjacent to the plurality of stacked semiconductor dies prior to disposing the plurality of thermal spreaders on the base die.

11. The method of claim 9, further comprising:
    applying a thermal interface material (TIM) layer on exposed surfaces of the plurality of stacked semiconductor dies and the plurality of thermal spreaders.

12. The method of claim 11, further comprising:
    disposing a heat sink on the exposed surfaces of the plurality of stacked semiconductor dies and the plurality of thermal spreaders.

13. The method of claim 12, further comprising:
    electrically coupling the heat sink to the base die.

14. The method of claim 9, wherein at least one of the thermal spreaders is formed from a metal or a metal alloy.

15. The method of claim 9, wherein at least one of the thermal spreaders includes a silicon semiconductor die.

16. The method of claim 9, wherein at least one of the thermal spreaders is formed from a silicon semiconductor die with one or more metal layers formed thereon.

17. The method of claim 9, wherein at least one of the thermal spreaders is formed from a plurality of interleaved dielectric and metal layers.

18. A semiconductor package, comprising:
- a base die;
- a plurality of stacked semiconductor dies on the base die;
- a plurality of thermal spreaders on the base die, the plurality of thermal spreaders disposed in one or more gaps between the plurality of stacked semiconductor dies or in one or more areas on the base die that are adjacent to the plurality of stacked semiconductor dies; and
- electrical connections between two or more of the base die, the plurality of stacked semiconductor dies, and the plurality of thermal spreaders.

19. The semiconductor package of claim 18, further comprising a heat sink disposed on exposed surfaces of the plurality of stacked semiconductor dies and the plurality of thermal spreaders.

20. The semiconductor package of claim 19, wherein a thermal interface material (TIM) layer is disposed between: (i) the heat sink; and (ii) the plurality of stacked semiconductor dies and the plurality of thermal spreaders.

21. The semiconductor package of claim 19, wherein the heat sink is electrically coupled to the base die.

22. The semiconductor package of claim 18, wherein at least one of the thermal spreaders is formed from a metal or a metal alloy.

23. The semiconductor package of claim 18, wherein at least one of the thermal spreaders includes a silicon semiconductor die.

24. The semiconductor package of claim 18, wherein at least one of the thermal spreaders is formed from a silicon semiconductor die with one or more metal layers formed thereon.

25. The semiconductor package of claim 18, wherein at least one of the thermal spreaders is formed from a plurality of interleaved dielectric and metal layers.

\* \* \* \* \*